United States Patent
Jayaraj et al.

(10) Patent No.: US 8,775,103 B1
(45) Date of Patent: Jul. 8, 2014

(54) PROXIMITY SENSOR CALIBRATION AND CONFIGURATION

(75) Inventors: Nagendra Bage Jayaraj, Sunnyvale, CA (US); Michael M. Lee, San Jose, CA (US)

(73) Assignee: Amazon Technologies, Inc., Reno, NV (US)

( * ) Notice: Subject to any disclaimer, the term of this patent is extended or adjusted under 35 U.S.C. 154(b) by 380 days.

(21) Appl. No.: 13/163,641

(22) Filed: Jun. 17, 2011

(51) Int. Cl.
*G01R 15/00* (2006.01)

(52) U.S. Cl.
USPC .......................................................... 702/57

(58) Field of Classification Search
USPC .......................................................... 702/57
See application file for complete search history.

(56) References Cited

U.S. PATENT DOCUMENTS

| | | | |
|---|---|---|---|
| 2005/0184870 A1* | 8/2005 | Galperin et al. | 340/568.2 |
| 2005/0261865 A1* | 11/2005 | Gibb et al. | 702/127 |
| 2005/0285740 A1* | 12/2005 | Kubach et al. | 340/572.1 |
| 2006/0290519 A1* | 12/2006 | Boate et al. | 340/573.4 |
| 2007/0182545 A1* | 8/2007 | Baum et al. | 340/539.11 |
| 2008/0051165 A1* | 2/2008 | Burgan et al. | 455/575.6 |
| 2009/0295409 A1* | 12/2009 | Irkliy | 324/658 |
| 2010/0085325 A1* | 4/2010 | King-Smith et al. | 345/174 |
| 2010/0219846 A1* | 9/2010 | Dubery | 324/686 |
| 2011/0012793 A1* | 1/2011 | Amm et al. | 343/702 |
| 2011/0281492 A1* | 11/2011 | Chan | 446/297 |
| 2012/0050221 A1* | 3/2012 | Kolokowsky et al. | 345/174 |
| 2012/0162073 A1* | 6/2012 | Kryze et al. | 345/158 |

* cited by examiner

*Primary Examiner* — Sujoy Kundu
*Assistant Examiner* — Alvaro Fortich
(74) *Attorney, Agent, or Firm* — Lee & Hayes, PLLC

(57) ABSTRACT

A user device may include a transmission power manager to control a transmission power level of a wireless transceiver based on a location of a human body proximate the user device as detected by a proximity sensor. During initiation, the user device may record proximity data. The transmission power manager may perform a statistical analysis of the proximity data to generate refined proximity data that excludes or minimizes outlier data. The modified proximity data may then be compared to preexisting proximity data to determine whether a human body is within a threshold distance from the proximity sensor. When the modified proximity data is outside a threshold from the preexisting stored proximity data, then the modified proximity data may be compared to default proximity data to determine whether a human body is within a threshold distance from the proximity sensor.

22 Claims, 10 Drawing Sheets

PROXIMITY SENSOR CALIBRATION AND CONFIGURATION

BACKGROUND

Computing devices have become commonplace in almost every environment. For example, mobile telephones, laptop computers, and tablet computers are commonly used for work and pleasure and accompany people in many daily activities. For example, people often travel with computers and mobile phones, bring these devices to school, and use these devices in public places. These electronic devices wirelessly communicate with a communications infrastructure to enable the consumption of digital media items, such as documents, images, music, and videos. Typically, a communications infrastructure sets transmission power levels for the electronic devices to use when transmitting data to the communications infrastructure rather than having the electronic devices make their own determinations regarding what transmission power levels to use.

Some bodies of research suggest that radiation absorption by the human body is undesirable and should be minimized when possible. For example, electronic devices may throttle a transmission power of a transceiver during wireless transmission of data in some situations. The United States Federal Communications Commission (FCC) specifies a specific absorption rate (SAR) of maximum radiation exposure allowed from electronic devices that operate in contact with a human body or very near a human body. Electronic devices must meet the FCC specifications while ideally providing maximum transmission power when used outside of the FCC threshold zones near human bodies.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

A user device may be capable of transmitting data using one or more wireless transceivers, such as a Wi-Fi transceiver, mobile telephone communication transceiver, Bluetooth® transceiver, or other wireless protocol transceivers, transmitters, and/or receivers. The user device may include a proximity sensor to sense a location of a human body proximate the user device or proximate a portion of the user device (e.g., near an antenna). In addition, the user device may include a transmission power manager that may control a transmission power level of the wireless transceivers based at least in part on information from the proximity sensor.

For example, a user device may transmit data at a first transmission power level. The user device may then detect, using the proximity sensor, a presence of a human body part within a predetermined distance from an antenna of the user device using one or more sensors disposed on and/or within the user device. In response to the detection of the presence of the human body part, the user device may transmit information at a second transmission power level that is less than the first transmission power level. The second transmission power level may be determined using a transmission power manager, which may determine the second transmission power level based at least in part on previously used transmission power levels.

During initiation of the wireless transceiver(s), the user device may record sample proximity data using the proximity sensors. The transmission power manager may perform a statistical analysis of the sample proximity data to generate refined proximity data that excludes outlier data points or data points that misrepresent a true proximity value. The modified proximity data may then be compared to preexisting stored proximity data to determine whether a human body is within a threshold distance from the proximity sensor(s). When the modified proximity data is outside a threshold from the preexisting stored proximity data, then the modified proximity data may be compared to default proximity data to determine whether a human body is within a threshold distance from the proximity sensor(s).

In some embodiments, the proximity sensors may measure capacitance to determine the proximity of the user device to a human body. However, capacitance may vary based on environmental conditions, such as changes in temperature, air density, salt concentration, or other factors that modify measured capacitance. Thus, when a user device is moved to a new location (e.g., different city, etc.), the user device may need to be recalibrated to obtain capacitance data that enable the proximity sensors to accurately identify a location of a human body within the threshold distance.

Illustrative Environment and User Device

Figure 1:
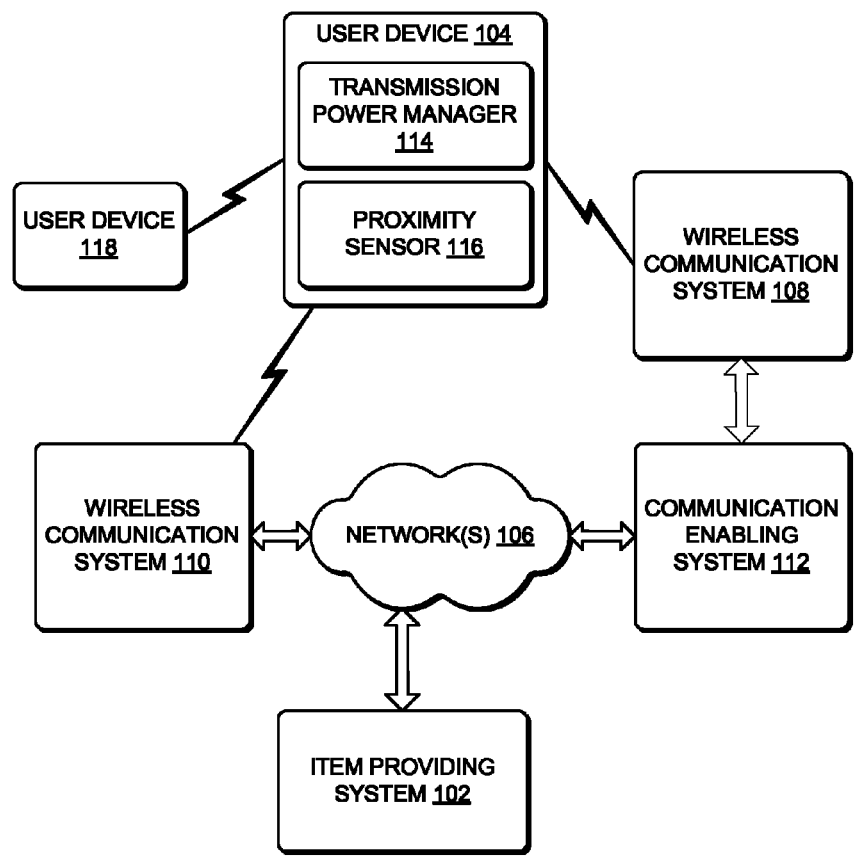
FIG. 1 is a schematic diagram of an illustrative computing architecture.

FIG. 1 is a schematic diagram of an illustrative computing architecture 100. The computing architecture 100 may include an item providing system 102 and one or more user devices 104 capable of communicating with the item providing system 102 via a network 106 (e.g., public network such as the Internet or private network such as a local area network (LAN)).

The user devices 104 may be variously configured with different functionality to enable consumption of one or more types of media items. The media items may be any type of format of digital content, including, for example, electronic texts (e.g., eBooks, electronic magazines, digital newspapers, etc.), digital audio (e.g., music, audible books, etc.), digital video (e.g., movies, television, short clips, etc.), images (e.g., art, photographs, etc.), and multi-media content. The user devices 104 may include any type of content rendering devices such as electronic book (eBook) reader devices, portable digital assistants, mobile phones, laptop computers, portable media players, tablet computers, cameras, video cameras, netbooks, notebooks, desktop computers, gaming consoles, DVD players, media centers, and any other device equipped with a wireless transceiver.

The item providing system 102 and the user devices 104 deliver and/or receive items, upgrades, and/or other information via the network 106. For example, the user devices 104 may download or receive items from the item providing system 102. The item providing system 102 also receives various requests, instructions and other data from the user devices 104 via the network 106. The item providing system 102 may include one or more machines (e.g., one or more server computer systems, routers, gateways, etc.) that have processing and storage capabilities to provide the above functionality.

Communication between the item providing system 102 and the user device 104 may be enabled via any communication infrastructure. One example of such an infrastructure includes a combination of a wide area network (WAN) and wireless infrastructure, which allows a user to use the user device 104 to purchase items and consume items without being tethered to the item providing system 102 via hardwired links. The wireless infrastructure may be provided by one or multiple wireless communications systems, such as wireless communication system 108 and wireless communication system 110. One of the wireless communication systems 108, 110 may be a wireless fidelity (Wi-Fi) hotspot connected with the network 106. Another of the wireless communication systems 108, 110 may be a wireless carrier system that can be implemented using various data processing equipment, communication towers, etc. Alternatively, or in addition, the wireless carrier system may rely on satellite technology to exchange information with the user device 104.

The communication infrastructure may also include a communication-enabling system 112 that serves as an intermediary in passing information between the item providing system 102 and the wireless communication system 108. The communication-enabling system 112 may communicate with the wireless communication system 108 (e.g., a wireless carrier) via a dedicated channel, and may communicate with the item providing system 102 via a non-dedicated communication mechanism, e.g., a public Wide Area Network (WAN) such as the Internet.

In some embodiments, while the user device 104 is connected with the wireless communication system 108 and/or wireless communication system 110, one or both of the wireless communication systems periodically or continuously specifies transmission power levels for the user device 104 to use for transmissions to that wireless communication system 108, 110. For example, conventional wireless carrier systems dictate what transmission power levels mobile phones are to use for communications with the wireless carrier systems. The transmission power levels that the wireless carrier systems specify continuously vary based on environmental factors such as a current signal to noise ratio, distance between the mobile phone and a nearest cell tower, obstacles between the mobile phone and the nearest cell tower, and so on. Unfortunately, wireless communication systems 108, 110 typically consider only signal strength when specifying what transmission power levels the user device is to use in transmissions of data. Wireless communication systems 108, 110 typically do not take into consideration radiation emitted by the user device 104 that may be absorbed by users of the user device 104, interference with other wireless connections, battery life of the user device 104, or other factors that may also be important to a user when specifying transmission power levels. Additionally, the user device 104 may have additional information that is not available to the wireless communication systems 108, 110. This additional information may be used to help determine what transmission power levels should be used.

The user device 104 disclosed herein overcomes the above shortcomings by controlling the transmission power levels of the user device independent of the specified transmission power levels dictated by the wireless communication systems 108, 110. In one embodiment, the user device 104 includes a transmission power manager 114 that receives a specified transmission power level from the wireless communication system 108 and performs an analysis of what transmission power levels should be used for the transmission of data to the wireless communication system 108. In one embodiment, the transmission power manager 114 uses the specified transmission power level as an upper threshold, and determines whether a transmission power level that is lower than the specified transmission power level should be used based at least in part on data collected by a proximity sensor 116.

In addition to wirelessly connecting to a wireless communication system 108, 110, the user device 104 may also wirelessly connect with other user devices (e.g., user device 118). For example, user device 104 may form a wireless ad hoc (peer-to-peer) network with user device 118. In addition to controlling the transmission power levels used to communicate with the wireless communication systems 108, 110, the transmission power manager 114 may also control the transmission power used to communicate with other user devices 118.

Although the preceding and following discussion refers to "transmitting" and "transmission", which may be implemented by a transceiver or a transmitter, embodiments may also cover operations of receivers, where appropriate.

Figure 2:
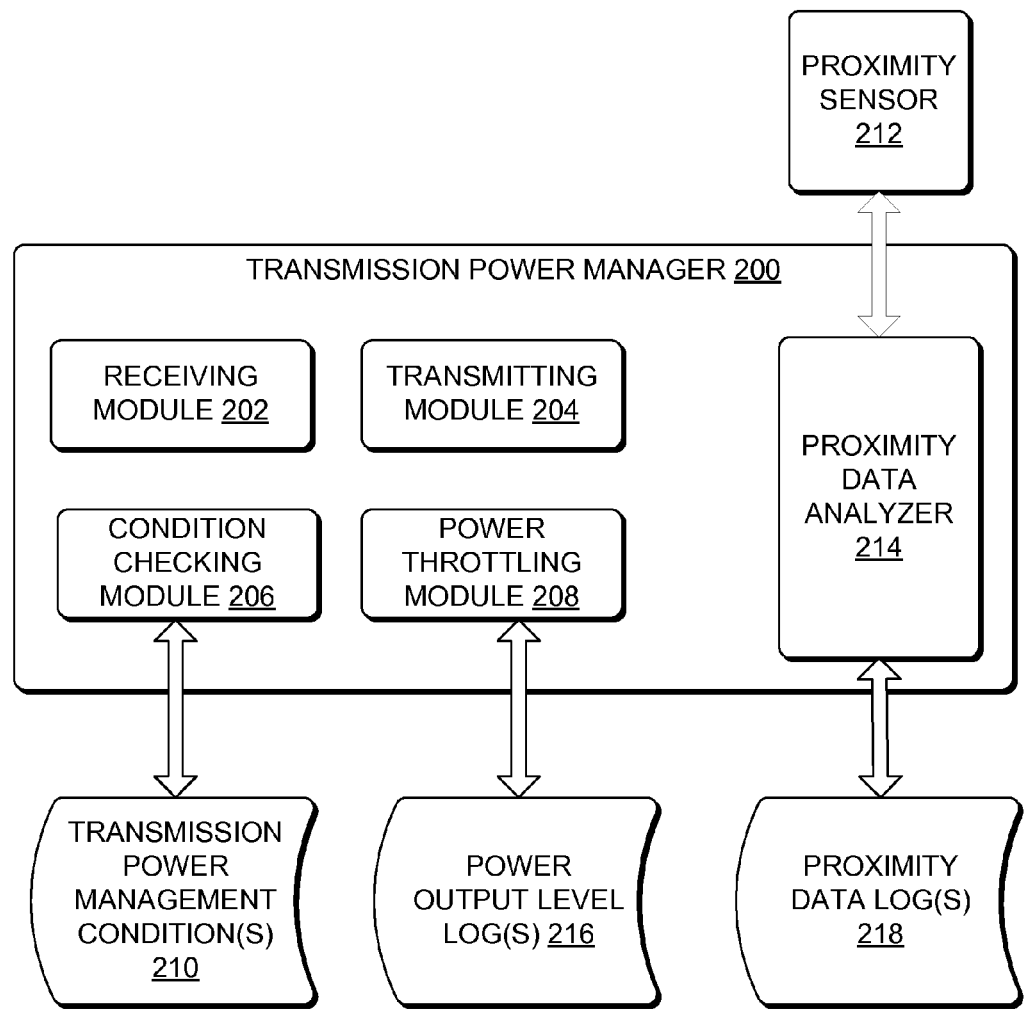
FIG. 2 is a block diagram of an illustrative transmission power manager.

FIG. 2 is a block diagram an illustrative transmission power manager 200, which may correspond to the transmission power manager 114 of FIG. 1. In some embodiments, the transmission power manager 200 includes a receiving module 202, a transmitting module 204, a condition checking module 206, and a power throttling module 208.

The receiving module 202 may receive commands to transmit data, which may identify specified transmission power levels to use for data transmission. The commands may specify explicit transmission power levels to use (e.g., may specify that a transmission power level of +50 dbm is to be used), or may specify a current transmission power level relative to a previously used transmission power level (e.g., an increase of 1 dbm or a decrease of 2 dbm). Commands may also indicate that a previously specified transmission power level should be used. Commands may originate from the wireless communication system 108, and may be routed to the transmission power manager 200 by a wireless transceiver and/or processor of the user device 104. These commands may also be received from other sources, such as applications running on the user device 104.

The condition checking module 206 may determine whether any transmission power management conditions 210 apply to forthcoming transmissions. For example, the transmission power management conditions 210 may apply to data received from the proximity sensor 212, which may correspond to the proximity sensor 116 of FIG. 1. The proximity sensor 212 may record proximity data, such as capacitance values sensed by one or more sensors and then analyzed by a proximity data analyzer 214 to remove outliers and otherwise manipulate the proximity data. The transmission power management conditions 210 may include proximity conditions associated with the proximity data output by the proximity data analyzer 214. In some embodiments, transmission power management conditions 210 may also include communications interference conditions, battery level conditions, power consumption conditions, and so on. The transmission power management conditions 210 may apply to communications via a particular wireless communication protocol, with a particular wireless communication system, associated with a particular application, etc. Some transmission power management conditions 210 may apply to multiple wireless protocols, wireless communications systems, applications, etc. For those transmission power management conditions 210 that apply to a current transmission, condition checking module 206 determines whether the conditions will be violated by the current transmission. For example, condition checking module 206 may determine whether transmission power management conditions will be violated by transmitting data at the specified transmission power level.

In various embodiments, the transmission power management conditions 210 include a human body part proximity condition based on the proximity data output by the proximity data analyzer 214. This condition may be violated (or alternatively satisfied) when a human body part is detected, or when it is determined that a human body part is closer than a threshold distance from the user device 104 or from an antenna of the user device.

In one embodiment, the power management conditions 210 include a maximum accumulated transmission power level condition. This transmission power management condition 210 may be violated when it is determined that more than the maximum accumulated transmission power level has been emitted within a proximity of a user (i.e., human body) over a sample period. The maximum accumulated transmission power level condition may be combined with the human body part proximity condition. Thus, the transmission power levels used while a human body part is detected may be recorded and summed to determine the amount of radiation to which the user has been exposed. When it is determined that the detected human body part has been exposed to more than a threshold amount of radiation (based on the accumulated transmission power levels), the condition may be violated.

The transmission power management conditions 210 may be stored in volatile or nonvolatile memory of the user device 104. In at least one embodiment, the power management conditions 210 are hard coded into the user device, and cannot be modified. Alternatively, the transmission power management conditions 210 may be updated by modifying existing power management conditions, adding new power management conditions, or deleting existing power management conditions.

In some embodiments, the condition checking module 206 maintains a transmission power level log 216 associated with transmission power levels of a particular antenna (or radio). In another embodiment, the condition checking module 206 maintains a transmission power level log 216 associated with transmission power levels of all antennas of the user device. Alternatively, the condition checking module 206 may maintain separate transmission power level logs for each antenna. The transmission power level log or logs 216 are records of past transmission power levels that have been used (e.g., in a defined sample period). The sample period may be, for example, 5 seconds, 10 seconds, 1 minute, 10 minutes, and so forth. For some power management conditions 210, such as the maximum accumulated transmission power level, the transmission power level log 216 is used to determine whether the power management condition 210 has been or will be violated.

Figure 5:
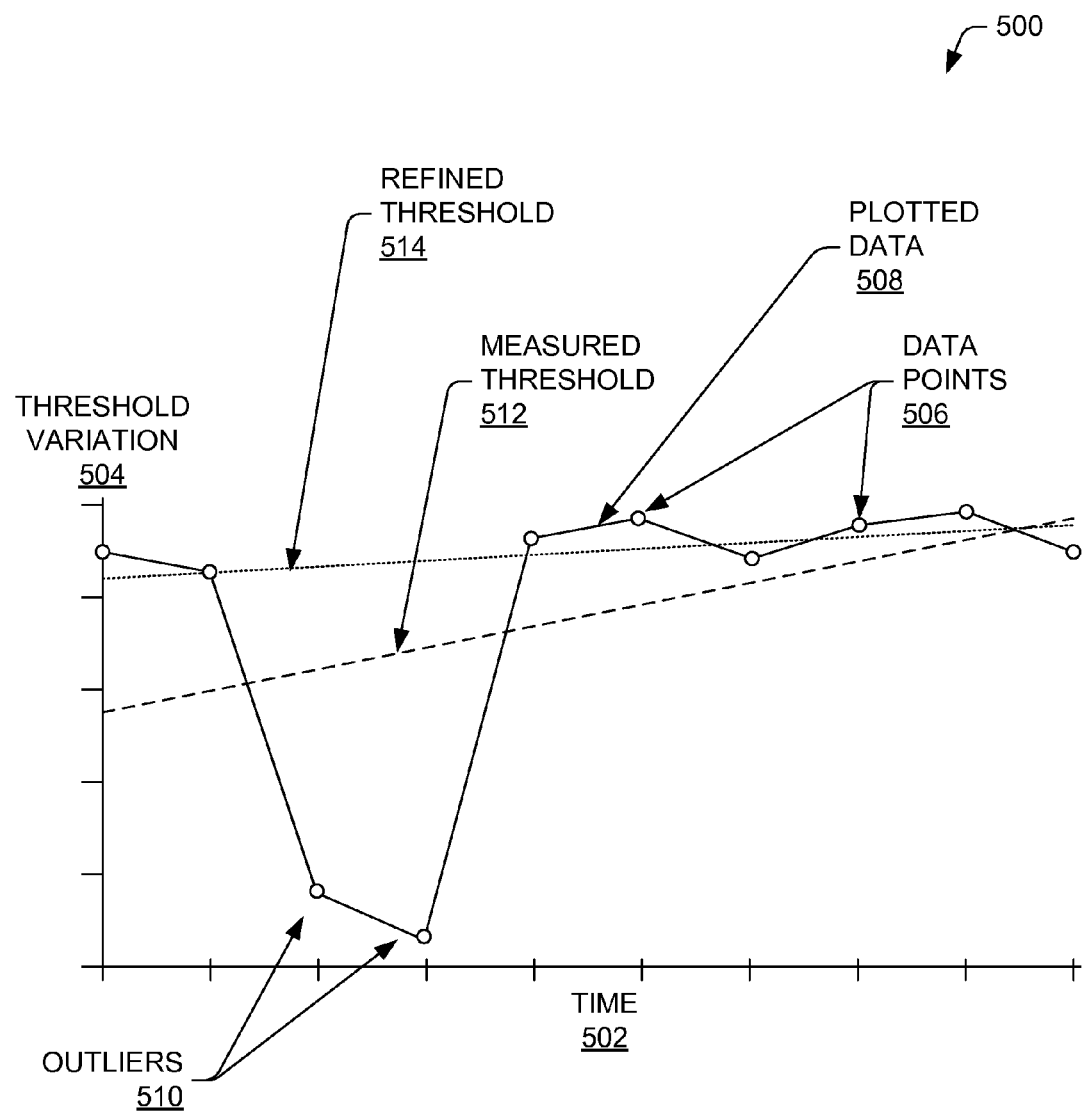
FIG. 5 is a graph of illustrative data showing identification of outlier data within a sample of data.
Figure 6A:
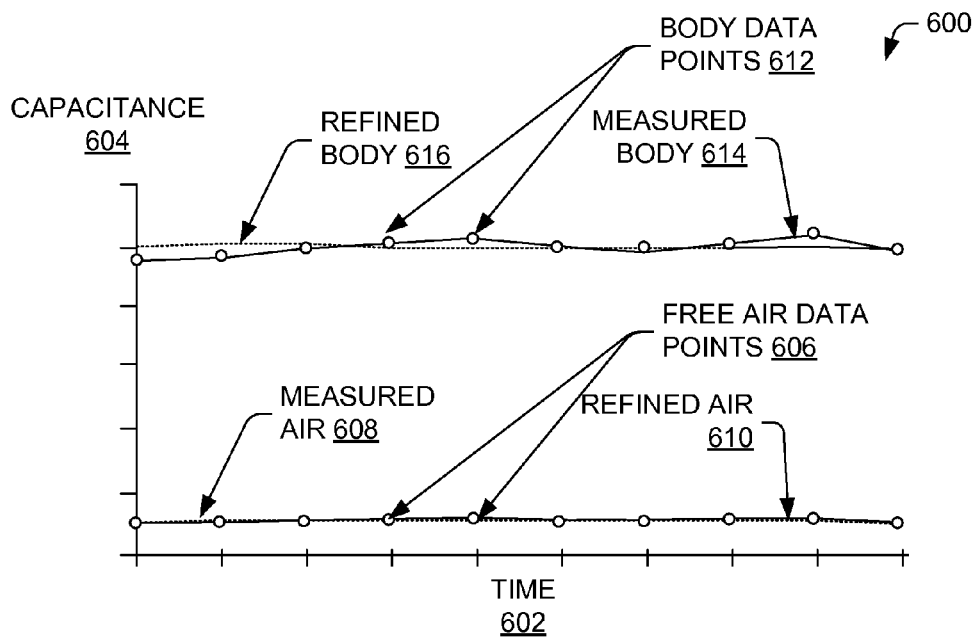
FIGS. 6a and 6b are graphs of illustrative capacitance data recorded by the user device.
Figure 6B:
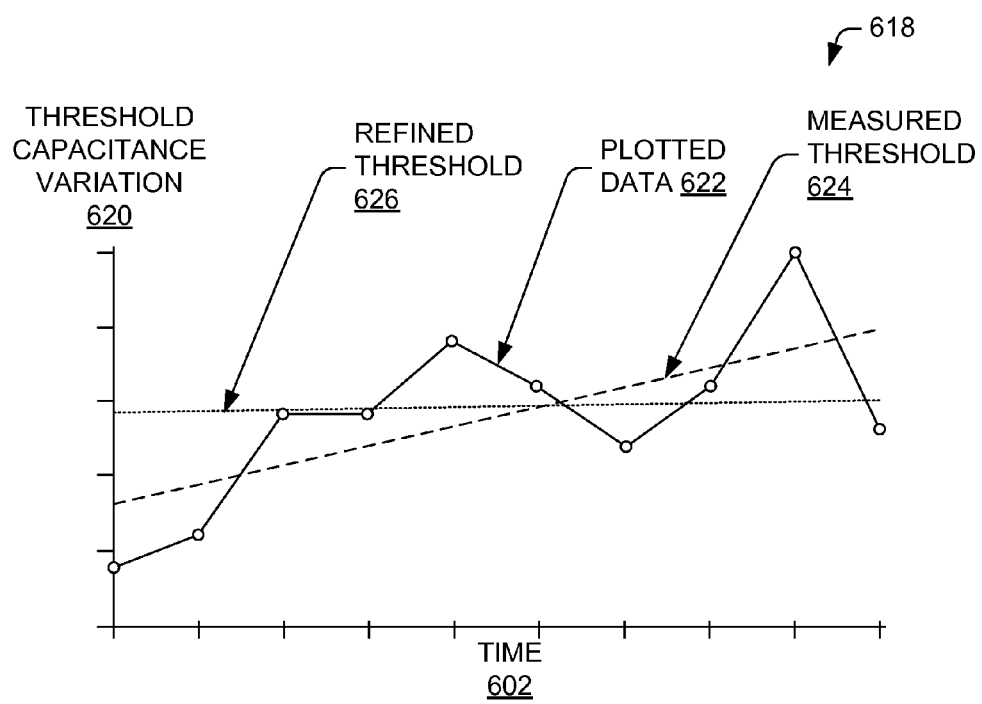

In various embodiments, the proximity data analyzer 214 may maintain a proximity data log 218 associated with proximity data of the proximity sensor 212. The proximity data log 218 may store data associated with various operating states, such as proximity data associated with proximity values when the antenna and/or the user device 104 are within a threshold distance from a human body and/or other ranges (or zones) from a human body. The proximity values may be capacitance values, which may be modified by the proximity data analyzer 214 to remove outlier data and generate refined proximity data for different operating modes (e.g., a low transmission power mode, a full power transmission power mode, etc.). In addition, the proximity data log 218 may store default proximity data, which may be associated with the various operating states. The default proximity data may be used in place of the stored data when no stored data is present (e.g., first use of the device), or measured data is statistically different than the stored data (e.g., device is moved to a new environment that affects measured capacitance). Sample proximity data is shown in FIGS. 5, 6a and 6b. The collection and analysis of the proximity data is further described with reference to FIGS. 7 and 8.

Power throttling module 208 may reduce a transmission power level used to transmit data to the wireless carrier system when one or more transmission power management conditions 210 have been violated (e.g., human body is within the threshold distance, etc.). The power throttling module 208 may reduce the transmission power level below a specified transmission power level incrementally. For example, the power throttling module may reduce the transmission power level in 1 db increments until a suitable transmission power level is reached. In one embodiment, a suitable transmission power level is an output level that will not cause any of the transmission power management conditions to be violated. Alternatively, a suitable transmission power level may be a level that will cause the transmission power management condition to stop being violated at some point in the future. For example, a suitable transmission power level may cause a trend towards eventual compliance with the violated transmission power management conditions 210.

Alternatively, the power throttling module 208 may compute or otherwise identify a suitable transmission power level, and reduce the current transmission power level to the suitable transmission power level in a single action. For example, a transmission power management condition 210 may specify that when the condition is violated, the transmission power level should be reduced to a predetermined transmission power level.

Power throttling module 208 may also reduce a duty cycle for the transmissions (e.g., space out the transmissions over time). Therefore, the power throttling module may adjust both the transmission power levels used for transmission and the frequency of those transmissions.

Transmitting module 204 transmits data to a wireless communication system or additional user device at either a specified transmission power level (e.g., as specified by the wireless communication system) or at a transmission power level determined by the power throttling module 208. The transmitting module 204 may transmit the data through one or more antennas included in the user device.

Figure 3:
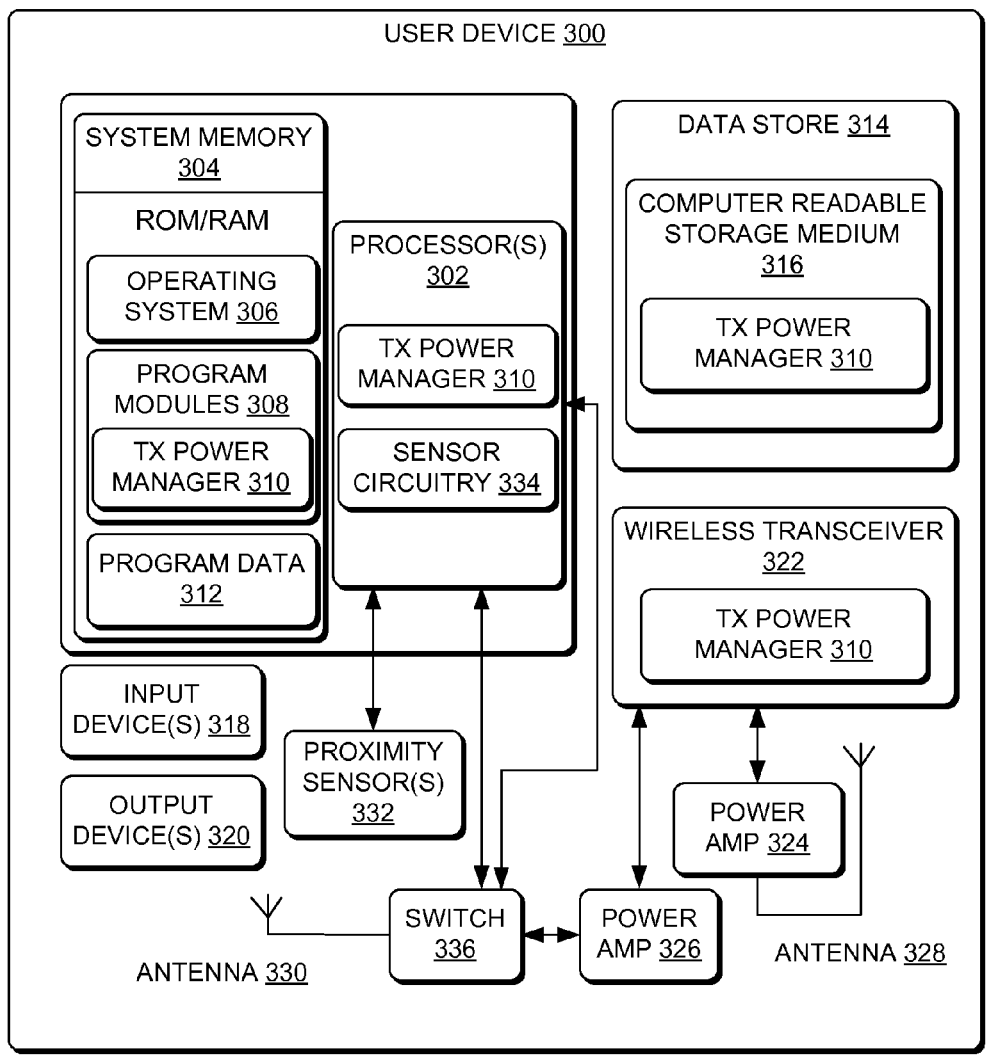
FIG. 3 is a block diagram of an illustrative user device.

FIG. 3 is a block diagram illustrating an exemplary user device 300. The user device 300 may correspond to the user device 104 of FIG. 1 and may be any type of computing device such as an electronic book reader, a PDA, a mobile phone, a laptop computer, a portable media player, a tablet computer, a camera, a video camera, a netbook, a desktop computer, a gaming console, a DVD player, a media center, and any other device that includes a wireless transceiver.

The user device 300 includes one or more processors 302, such as one or more CPUs, microcontrollers, field programmable gate arrays, or other types of processors. The user device 300 also includes system memory 304, which may correspond to any combination of volatile and/or non-volatile storage mechanisms. The system memory 304 stores information which provides an operating system component 306, various program modules 308 such as transmit (TX) power manager 310, program data 312, and/or other components. The user device 300 performs functions by using the processor(s) 302 to execute instructions provided by the system memory 304.

The user device 300 also includes a data storage device 314 that may be composed of one or more types of removable storage and/or one or more types of non-removable storage. The data storage device 314 includes a computer-readable storage medium 316 on which is stored one or more sets of instructions embodying any one or more of the methodologies or functions described herein. As shown, instructions for the transmission power manager 310 may reside, completely or at least partially, within the computer readable storage medium 316, system memory 304 and/or within the processor(s) 302 during execution thereof by the user device 300, the system memory 304 and the processor(s) 302 also constituting computer-readable media. The user device 300 may also include one or more input devices 318 (keyboard, mouse device, specialized selection keys, etc.) and one or more output devices 320 (displays, printers, audio output mechanisms, etc.). In some embodiments, the input devices 318 and/or the output device 320 may be accessories that may alter capacitance measured by the proximity sensor. This is discussed in further detail with reference to FIG. 9.

The user device 300 further includes a wireless transceiver 322 to allow the user device 300 to communicate via a wireless network (e.g., such as provided by the wireless communication system) with other computing devices, such as remote computers, the item providing system, and so forth. The wireless transceiver 322 allows the user device 300 to handle both voice and non-voice communications (such as communications for text messages, multimedia messages, media downloads, web browsing, etc.) with the wireless communication system 108. The wireless transceiver 322 may provide network connectivity using any type of mobile network technology including, for example, cellular digital packet data (CDPD), general packet radio service (GPRS), enhanced data rates for GSM evolution (EDGE), universal mobile telecommunications system (UMTS), 1 times radio transmission technology (1xRTT), evaluation data optimized (EVDO), high-speed downlink packet access (HSDPA), Wi-Fi, etc. In one embodiment, the wireless transceiver includes the transmission power manager 310 in addition to, or instead of, the transmission power manager 310 being included in the computer readable storage medium 316, system memory 304 and/or processor(s) 302. The transmission power manager 310 may be implemented as hardware, firmware and/or software of the wireless transceiver 322.

The wireless transceiver 322 may generate signals and send these signals to power amplifier (amp) 324 or power amp 326 for amplification, after which they are wirelessly transmitted via the antenna 328 or the antenna 330, respectively. The antennas 328 and 330 may be configured to transmit in different frequency bands and/or using different wireless communication protocols. The antennas 328, 330 may be directional, omnidirectional or non-directional antennas. In addition to sending data, the antennas 328, 330 also receive data, which is sent to wireless transceiver 322 and transferred to processor(s) 302.

Although a single wireless transceiver 322 is shown to control transmission to both antennas 328 and 330, the user device 300 may alternatively include multiple wireless transceivers, each of which is configured to transmit data via a different antenna and/or wireless transmission protocol. In one embodiment, each wireless transceiver includes an independent transmission power manager. Alternatively, a single transmission power manager (e.g., that is included in system memory 304, processor 302 and/or data storage 314) may control transmission power levels used by each wireless transceiver. In addition, the user device 300, while illustrated with two antennas 328, 330, may include more or fewer antennas in various embodiments.

In some embodiments, user device 300 includes one or more proximity sensors 332. The proximity sensors 332 can detect the presence of human body parts, and convey information regarding the detected presence to processor(s) 302. In various embodiments, the proximity sensors 332 may be capacitive sensors that are configured to measure capacitance generated by the presence of the human body part using any one of various techniques known in the art, for example, relaxation oscillation, a current verses voltage phase shift comparison, resistor-capacitor charge timing, capacitive bridge division, charge transfer, sigma-delta modulation, or charge-accumulation.

The proximity sensors 332 may also other types of sensors. For example, the proximity sensors 332 may be optical (e.g., infrared) sensors that use an emitter and receiver pair to detect the presence of opaque objects. Alternatively, the proximity sensors 332 may be inductive sensors, which include an inductive loop. When the presence of a human body part (or metal object) is brought close to the inductive sensor, an induction of the inductive loop changes, causing the human body part to be detected. Alternatively, the proximity sensors 332 may be ultrasonic sensors that emit an ultrasonic signal and measure a time duration between when a signal is transmitted and the reflection of that signal received (a.k.a., flight response). The proximity sensors 332 may also include other types of sensors, such as those that operate using the detection principles of resistive (e.g., analog resistive, digital resistive or residual resistive), surface acoustic wave, electromagnetic, near field imaging, or other technologies. In one embodiment, multiple different types of sensors are used. Though the detected object is described herein as a human body part, other types of objects may also be detected depending on the sensing technologies used.

The processor(s) 302 may include sensor circuitry 334 (e.g., sensor device drivers) that enables the processor(s) 302 to interpret signals received from the proximity sensor(s) 332. In one embodiment, the proximity sensors 332 output fully processed signals to the processor(s) 302. For example, the proximity sensors 332 may output capacitance, a distance, a detected/not detected signal, etc. using a single line interface or a multi-line interface. In another embodiment, the proximity sensors 332 output, for example, positional data and/or object presence data (e.g., of a human body part) to the processors 302 without first processing the data. In either instance, the processors 302 may use the sensor circuitry 334 to process and/or interpret the received data. If data is received from multiple of the proximity sensors 332, processing the data may include averaging the data, identifying a maximum from the data, or otherwise combining the data from the multiple sensors. In one embodiment, in which the sensors 332 include a sensor array, numerous sensors, or a touch panel, processing the data includes determining where on the user device the human body part is located from multiple sensor readings.

In one embodiment, antenna 330 is used as a proximity sensor (e.g., as a sensor electrode for a proximity sensor). To enable the use of antenna 330 as a proximity sensor, a switch 336 disconnects the antenna 330 from power amp 326 (and thus from the wireless transceiver 322), and connects antenna 330 to sensor circuitry 334 and/or to a proximity sensor integrated circuit that connects to sensor circuitry 334. While there is an electrical connection between sensor circuitry 334 and antenna 330, the antenna 330 provides signals to sensor circuitry 334. The sensor circuitry 334 processes the signals to determine whether the presence of a human body part is detected. While there is an electrical connection between antenna 330 and power amp 326, antenna 330 may be used to transmit and receive information (e.g., to maintain a wireless connection). In one embodiment, by default the switch 336 maintains an electrical connection between power amp 326 and antenna 330.

In one embodiment, processor 302 controls whether the switch 336 provides an electrical connection between the sensor circuitry 334 and the antenna 330 or between the power amp 326 and the antenna 330. Alternatively, or in addition, the wireless transceiver 322 may control the switch 336. The switch 336 may provide an electrical connection between sensor circuitry 334 and antenna 330 on a periodic or other basis (e.g., every 500 ms or ever 1 s). The electrical connection between the sensor circuitry 334 and the antenna 330 may then be sustained for a predetermined time period (e.g., 100 ms), after which the electrical connection between the antenna 330 and sensor circuitry 334 is terminated, and an electrical connection between the power amp 326 and the antenna 330 is established. In one embodiment, it is determined when antenna 330 will not be sending or receiving data, at which point the switch 336 establishes an electrical connection between antenna 330 and sensor circuitry 334.

Note that an additional switch may be interposed between power amp 324 and the antenna 328, which may function in the manner described above with reference to switch 336. The additional switch may have connections to sensor circuitry 334 and processor 302 as shown for the switch 336.

Figure 4:
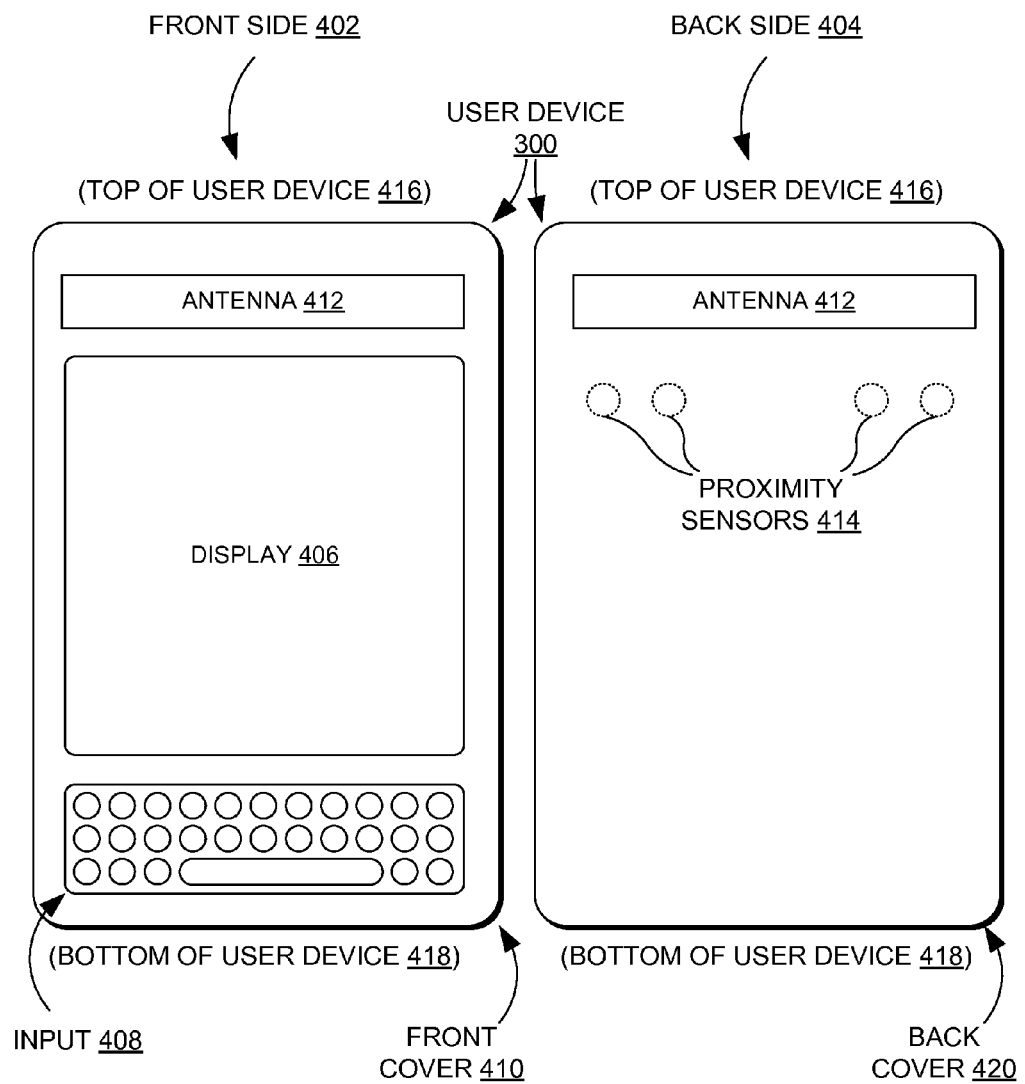
FIG. 4 is a schematic diagram of a front side and a back side of the user device.

FIG. 4 is a schematic diagram of a front side 402 and a back side 404 of the user device 300. A front side 402 includes a display 406 and optionally an input 408 housed in a front cover 410. The display 406 may use any available display technology, such as electronic ink (e-ink), liquid crystal display (LCD), transflective LCD, light emitting diodes (LED), laser phosphor displays (LSP), and so forth. The input 408 may include a keyboard, touch pad, or other input mechanism. In one embodiment, the display 406 and input 408 are combined into one or more touch screens.

Disposed inside the user device 300 are an antenna 412 and one or more proximity sensors 414. As shown, the antenna 412 is positioned near a top 416 of the user device. However, the antenna 412 may also be positioned at other locations, such as at a side of the user device 300 or near the bottom 418 of the user device 300.

Disposed at a back side of the user device 300 are the one or more proximity sensors 414. The proximity sensors 414 may correspond to the proximity sensor(s) 332 that were described with reference to FIG. 3. The proximity sensors 414 may be capacitive sensors, inductive sensors, magnetic sensors, infrared sensors, ultrasonic sensors, or the like. The sensors 414 may also be touch sensors such as a resistive touch sensor, a capacitive touch sensor, a mechanical touch sensor (e.g., a mechanical button), or the like.

The antenna 412 and the proximity sensors 414 are shown in the illustrated embodiment using dashed lines to indicate that these components are not on a surface of the user device 416 (e.g., that they are inside a back cover 420). However, in alternative embodiments these components may be on a surface of the user device 300.

Note that in one embodiment the proximity sensors 414 are disposed proximate to the antenna 412 to detect when a human body part is close to the antenna 412. This may include detecting a distance between the antenna 412 and the human body part. The proximity sensors 414 may be disposed in an approximately linear pattern. Alternatively, the sensors 414 may be disposed in other patterns at the back side 404 of the user device 300. Such additional patterns may include a rectangular pattern, an elliptical pattern, a checkerboard pattern, or other pattern. The proximity sensors 414 may be discrete sensors, or may be linear sensor arrays, other sensor arrays, a touch panel, slider sensors, or the like. The proximity sensors 414 may also be a single proximity. For example, a single proximity sensor may be included that is substantially equal to the size of the entire back cover 420 of the user device 300. As shown, the proximity sensors 414 are disposed between the antenna 412 and the bottom 418 of the user device 300. However, the proximity sensors 414 may also be disposed at other locations with relation to the antenna 412, such as between the antenna 412 and the top 416 of the user device 300. Though the proximity sensors 414 are shown only at the back side 404 of the user device 300, the front side 402 of the user device 300 may also include other sensors. In one embodiment, as described above with reference to FIG. 3, the antenna 412 itself acts as a proximity sensor.

Illustrative Proximity Data

FIG. 5 is a graph of illustrative data 500 showing identification of outlier data within a sample of data and establishment of a refined threshold that excludes the outlier data. The data 500 may be plotted on the graph with respect to time 502 and a threshold variation 504, which may be based on a change in capacitance, distance, or another measurement. The proximity data is described as capacitance data for illustrative purposes and may be obtained by the proximity sensors 414 of FIG. 4.

Initially, the proximity sensors 414 may measure data points 506 at predetermined and/or random time intervals. For example, the data points 506 may be based on samples of proximity data taken by the user device after the user device activates (turns on) the wireless transceiver 322. The data points 506 may be plotted as plotted data 508 to show the threshold variance 504, such as a variance in capacitance values. Some of the data points may be outliers 510, which include a threshold value that is statistically different than the other ones of the data points 506.

A measured threshold 512 may be an average that includes the outliers and thus may skew a representation of the data toward (and because of) the outliers 510. In some embodiments, the measured threshold may be calculated using linear regression.

In accordance with some embodiments, the data points 506 may be represented by a refined threshold 514. The refined threshold 514 may be exclude the outliers 510 or at least minimize an influence of the outliers. In some embodiments, the refined threshold may be calculated using weighted regression. The weighted regression approach may create a more accurate representation of the sample of the data points 506, and may be used to establish a threshold value for a sample of data points. The refined threshold 514 may then be compared to established data from the proximity data log(s) 218 shown in FIG. 2, which may then be used to adjust a power level of the transmitting module 204 when the proximity data indicates a close proximity to a human body (e.g., within a threshold distance, etc.). The refined threshold 514 may also be stored as the established data from the proximity data log(s) 218 and used to adjust a baseline over time.

FIGS. 6*a* and 6*b* are graphs of illustrative capacitance data recorded by the user device. FIG. 6*a* shows illustrative capacitance data 600 plotted with respect to time 602 and capacitance 604, which may be measured by the proximity sensors 414. When the proximity sensors are in free air (not within the threshold distance from a human body), then the capacitance may include a lower value than when the proximity sensors are within the threshold distance from a human body, which increases the capacitance.

As shown in FIG. 6*a*, free air data points 606 may be plotted for capacitance recorded by the proximity sensors 414 when the user device 300 is operating in free air. The free air data points 606 may be used to create a measured air value 608 using linear regression, which may be skewed by outlier data points as described with reference to FIG. 5. In some embodiments, the free air data points 606 may be used to create a refined air value 610 using weighted regression, which may minimize or remove an affect of outlier data points, and thereby create a more representative value of a true capacitance in free air.

The user device 300 may placed within a threshold distance from a human body (or another representative body such as specific absorption rate (SAR) matter using to simulate a human body during testing and calibration). The proximity sensors 414 may record capacitance values shown by body data points 612. The body data points 612 may be used to create a measured body value 614 using linear regression, which may be skewed by outlier data points as described with reference to FIG. 5. In some embodiments, the body data points 612 may be used to create a refined body value 616 using weighted regression, which may minimize an affect of outlier data points, and thereby create a more representative value of a true capacitance when the user device is within the threshold distance from a human body (or the SAR matter).

FIG. 6*b* shows illustrative capacitance data 618 having a variation in capacitance between data points recorded in free air and near the human body (or SAR matter) as shown in FIG. 6*a* with respect to the time 602 and a threshold capacitance variation 620. The variation in capacitance between the data points is depicted as plotted data 622. In addition, FIG. 6*b* shows a variance of the measured data shown as measured threshold data 624 using linear regression and a variance of the refined data shown as refined threshold data 626 using the weighted regression, each reflecting a variation of the corresponding data shown in FIG. 6*a*.

Illustrative Operation

Figure 7:
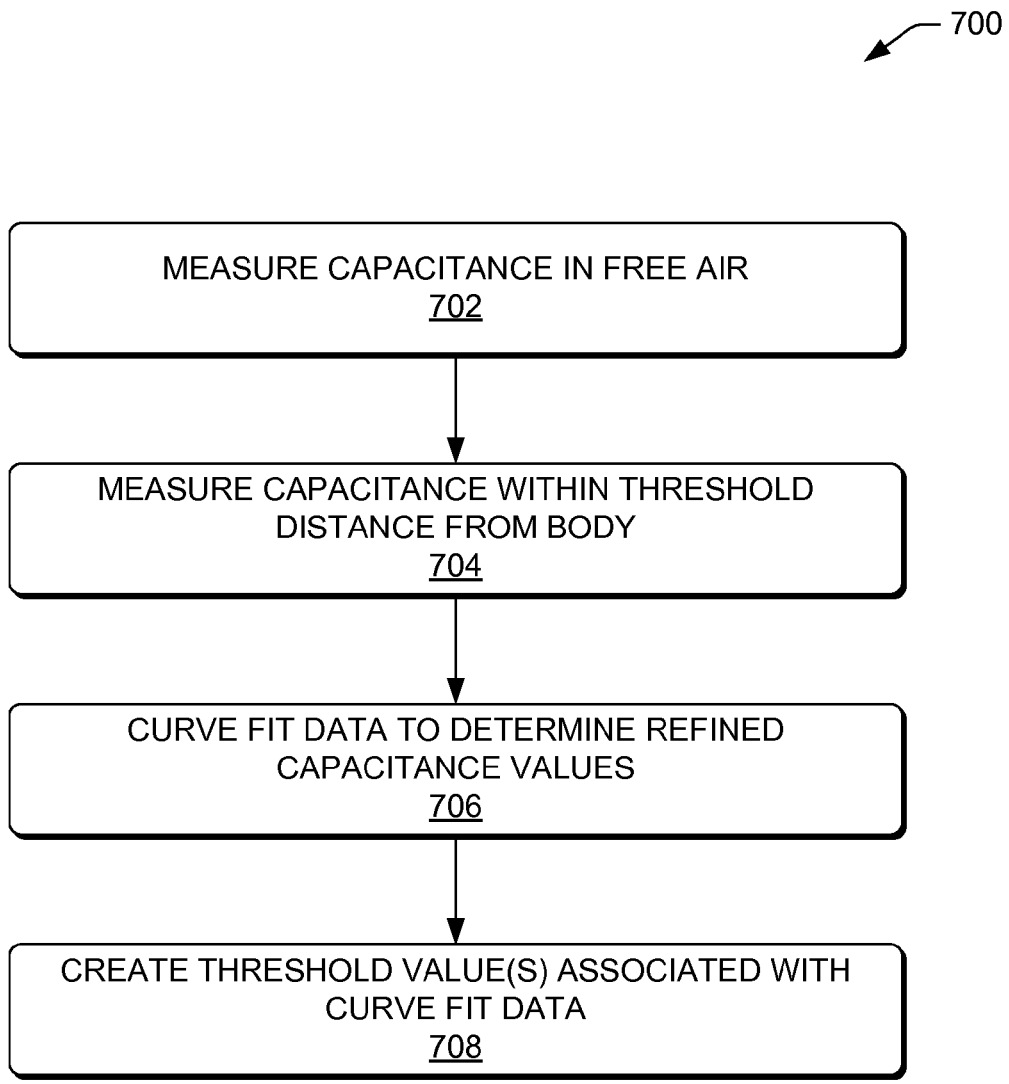
FIG. 7 is a flow diagram of an illustrative process to calibrate a proximity sensor based on various environmental conditions.

FIG. 7 is a flow diagram of an illustrative process 700 to calibrate a proximity sensor based on various environmental conditions. The process 700 is illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. Other processes described throughout this disclosure (in FIGS. 8-10), in addition to process 700, shall be interpreted accordingly.

The process 700 is described with reference to FIGS. 1-4 and may be performed by the user device 300. Of course, the process 700 (and other processes described herein) may be performed in other similar and/or different devices and/or in different environments.

At 702, the proximity sensor 212 may measure capacitance in free air when a human body and/or the SAR matter is not within a threshold distance from the user device 300. The measurements may be stored in the proximity data log 218. Example free air data is shown in FIG. 6*a* as the free air data points 606.

At 704, the proximity sensor 212 may measure capacitance when a human body and/or the SAR matter is within the threshold distance from the user device 300. The measurements may be stored in the proximity data log 218. Example body data is shown in FIG. 6*a* as the body data points 612.

At 706, the proximity data analyzer 214 may curve fit data to determine representative capacitance values for the free air data points (i.e., the refined air values 610) and the body data points (i.e., the body values 616). In accordance with various embodiments, the proximity data analyzer 214 may use weighted regression to remove or minimize an influence of outlier data points and to create a refined value for each of the free air capacitance and the capacitance near a human body.

At 708, the proximity data analyzer 214 may create threshold values associated with the curve fit data. The threshold values may be used to distinguish capacitance of operation in free air from capacitance values when the user device 300 is within the threshold distance from a human body and/or SAR matter. The threshold values may be the refined threshold value 622 shown in FIG. 6*b*.

The process 700 may be used to calibrate the user device 300, and may be used to establish default proximity data that may be used when current data does not conform to preexisting data stored in the proximity data log 218, as explained in further detail below.

Figure 8:
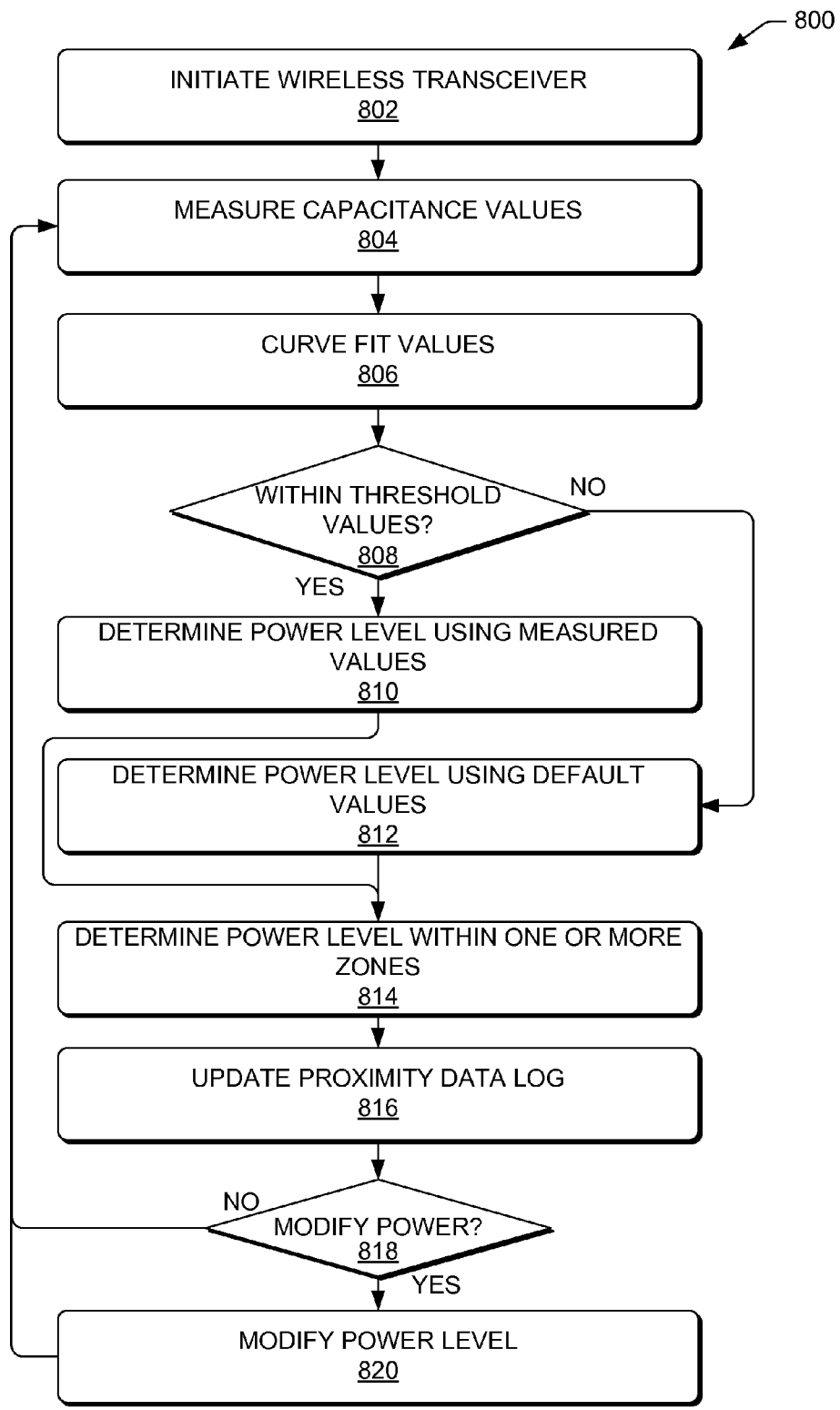
FIG. 8 is a flow diagram of an illustrative process to calibrate the proximity sensor after powering up a wireless transceiver.

FIG. 8 is a flow diagram of an illustrative process 800 to calibrate the proximity sensor after powering up a wireless transceiver. For example, the process 800 may occur after turning on the user device 300 and/or powering up the wireless transceiver 322 after the wireless transmitter has been deactivated.

At 802, the user device 300 may initiate the wireless transceiver 322. The initiation of the wireless transceiver often takes a number of seconds to enable the user device 300 to connect to one or more other devices via the network 106.

At 804, and during or after the initiation at 802, the proximity sensor 212 may measure capacitance values and obtain sample data as shown in the graph in FIG. 6*a*. In some embodiments, the measured capacitance values may be stored in the proximity data log 214.

At 806, the proximity data analyzer 214 may curve fit the measured capacitance values to create new data. For example the proximity data analyzer 214 may apply the weighted regression to remove the outlier data and create the new data that represents a true value of the capacitance measured by the proximity device. In some embodiments, the new data (i.e., the refined values) may be stored in the proximity data log 214.

At 808, the user device 300 may compare the new data to data stored in the proximity data log 218. The data stored in the proximity data log 218 may include the refined values (e.g., the refined air 610 and/or the refined body 616) and/or default proximity data of the refined air or body data. The comparison may use the refined values, when available, in the comparison. In some embodiments, the comparison in the operation 808 may use other factors in addition to or without using the capacitance values. For example, the comparison may compare a previous location of the user device 300 prior to a power up to a current location of the user device. When the locations are different beyond a threshold amount (e.g., in a different city, state, etc.), then the operation may determine the comparison is false and proceed via the route labeled "no."

When the comparison determines that the new data is within thresholds defined by the refined values (following the "yes" route), then the power throttling module 208 may determine a power level using the new data. In some embodiments, the comparison may allow additional deviation of the new data from the thresholds based on the refined values to compensate for some drift in the capacitance values. For example, the addition deviation may be a relatively small percentage change (e.g., 0.5%, 1%, 2%, etc.) or a fixed value change (+/−1, 5 10, etc.) of capacitance.

When the refined data is not within the thresholds or the recent threshold data is not available, then the process 800 may proceed at 812. At 812, the power throttling module 208 may determine a power level using the default values.

Continuing to an operation 814 via the operations 810 or 812, the power throttling module 208 may determine a power level within one or more zones of operations. When the new data is consistent with previous data (e.g., within thresholds, et.) that is stored in the proximity data log 218, then a power level associated with the previous data may be used to control the power of a wireless transceiver 322. For example, when the new data is within a threshold range of data that is associated with a close proximity to a human body (or SAR matter), e.g., within a first threshold distance, then the power value may be set to a lowest value. In some embodiments, other zones may be established which each may have their own threshold values and associated power levels. However, in some embodiments, only two zones (near body and free air) may be used.

At 816, the proximity data analyzer may update the proximity data log 218 with the new data. By updating the proximity data log 218, the new data may include environmental changes that change the capacitance readings from the proximity sensor 212. For example, environment changes may include changes in temperature, air density, salt concentration, or other factors that cause the proximity data to drift or shift away from prior measured proximity data.

At 818, the transmit power manager 200 may determine whether to modify a power of the wireless transceiver 322 in accordance with the determined power from the operation 814. When the transmit power manager 200 determines to modify a power of the wireless transceiver (following "yes" route), then at 820, the transmit power manager 200 modifies the power of the transceiver. Following the operation 820, or the decision 818 (via the "no" route from the operation 818), the process 800 may continue at the operation 804 by measuring capacitance values again and continually adjusting, when necessary, the transmission power level based on a detection of the human body (or SAR matter) within the threshold distance.

Figure 9:
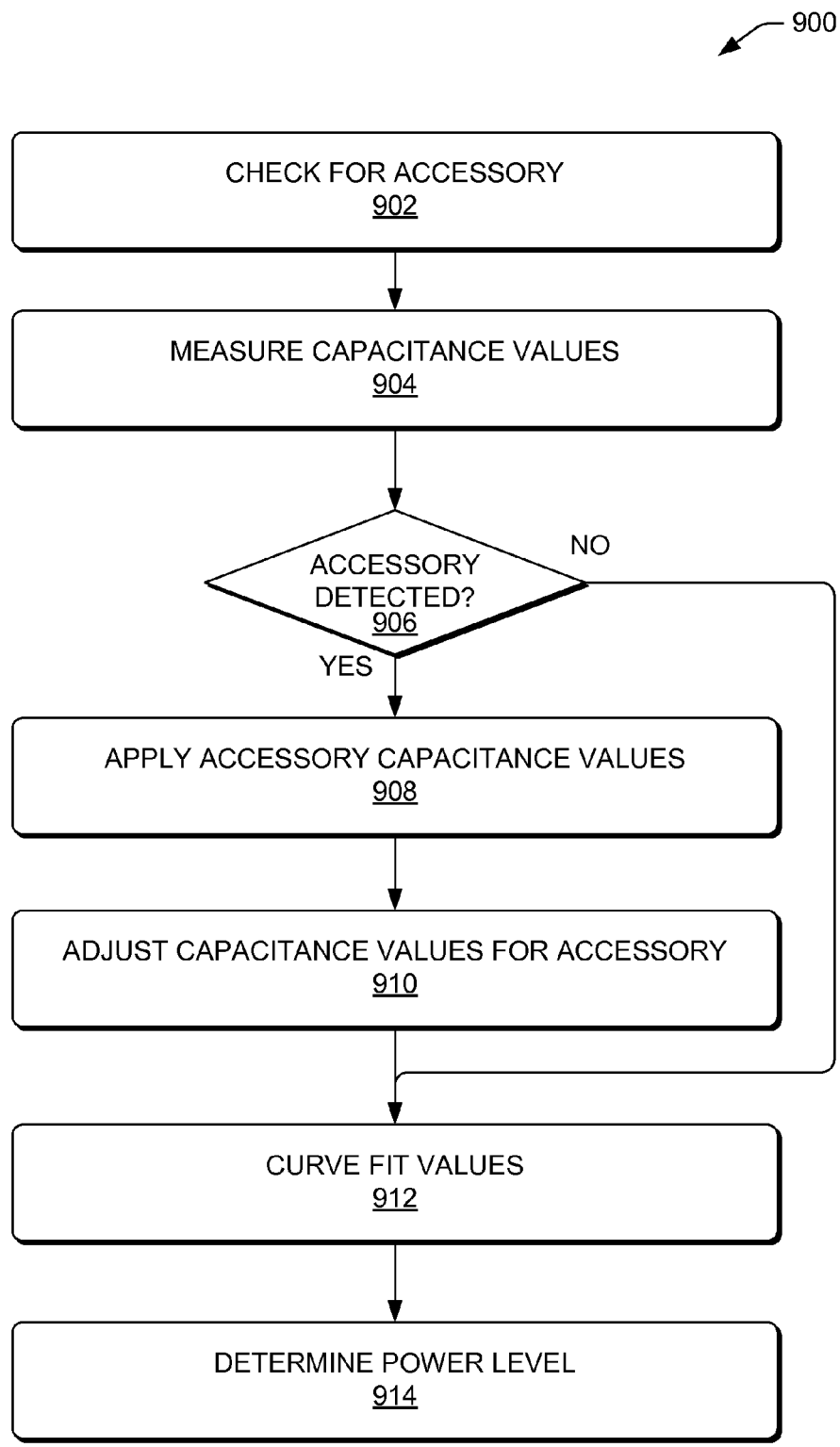
FIG. 9 is a flow diagram of an illustrative process to adjust a proximity sensor to compensate for use of accessories with the user device.

FIG. 9 is a flow diagram of an illustrative process 900 to adjust a proximity sensor to compensate for use of accessories with the user device 300. In some instances, the user device 300 may be configured to accept attachment of an accessory (e.g., coupled accessory) or may be used with an accessory (e.g., a cover, pad, etc.). The proximity of the accessory may modify the measured capacitance of the proximity sensor and thereby possibly disrupt the operation of the wireless transceiver 322 if not otherwise compensated for in accordance to the process 900, as described below.

At 902, the user device 300 may identify whether an accessory is proximate the user device. In some embodiments, the user device 300 may detect the accessory after the accessory is coupled to the user device, such as by a data port or other physical or wireless connection that is identifiable by the user device (e.g., as one of the input devices 318 and/or output devices 320). In various embodiments, a user may communicate to the user device that an accessory is being used with the user device, such as by modifying user settings using a user interface. In some embodiments, the user device 300 may determine capacitance values for a discovered or user-designated accessory via a lookup table, that may be stored locally or by a server.

At 904, the proximity sensor 212 may measure capacitance values and obtain sample data similar to the operation 804 of FIG. 8.

At 906, the user device 300 may determine whether an accessory was detected based at least on the determination at the operation 902. When an accessory is detected at the decision operation 906, then processing may proceed at 908.

At 908, the proximity data analyzer 214 may apply an adjustment to the measured capacitance values from the operation 904. For example, the proximity data analyzer 214 may access adjustment capacitance values associated with the accessory to modify the measured capacitance values to reflect a true capacitance value as if the accessory was not used with the user device. By applying the adjustment, the proximity data analyzer 214 may determine capacitance values that are similar to capacitance values that would be measured had the accessory not be used with the user device. The adjustment capacitance values may be stored in memory and may be updated by communication with a remote server.

At 912, the proximity data analyzer 214 may curve fit the measured capacitance values that may include the adjustments via the operation 912 or may not include the adjustments (via the "no" route from the decision operation 906) to create new data similar to the operation 806 of FIG. 8. For example, the curve fitting may use the weighted regression to remove or minimize an affect of outlier data points.

At 914, the power throttling module 208 may determine a power level, which may be used to throttle the power level of the wireless transceiver as needed based on the capacitance values. The operation 914 may be performed similar to the operation 814 of FIG. 8.

Figure 10:
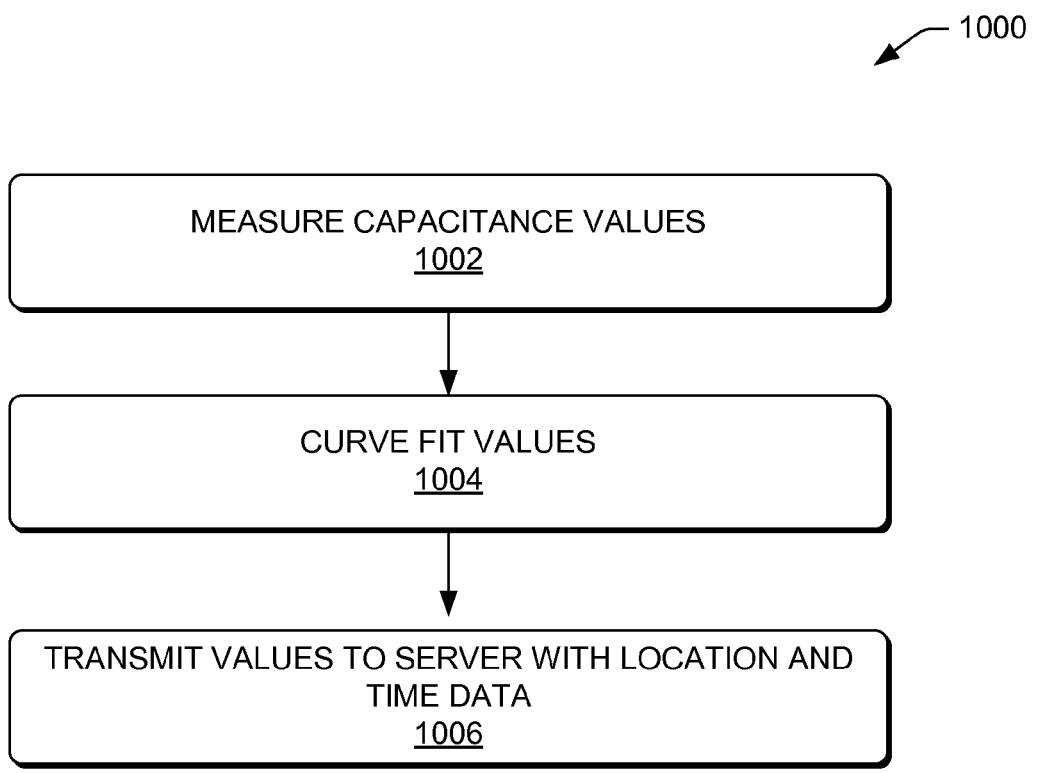
FIG. 10 is a flow diagram of an illustrative process to enable sharing of proximity sensor calibration data between user devices.

FIG. 10 is a flow diagram of an illustrative process 1000 to enable sharing of proximity sensor calibration data between user devices. As discussed above, each user device may store proximity data in the proximity data log 218. The stored proximity data may reflect measured capacitance values for a given location during a given time period. When a user device is first used in a new location, the user device may access the default proximity data when the refined data is outside of the threshold values (via the "no" route from the decision operation 808 to the operation 812 of FIG. 8). However, location and time specific refined proximity data may be maintained by a server and distributed to user devices within the location (e.g., a zip code, a threshold radius, etc.) to populate or add to the proximity data log 218. Thus, a user device entering a new location may be updated with location and time specific data that is current (obtained from another device within a threshold amount of time since creation of the proximity data). The user device may then use the newly obtained (shared) proximity data to test the threshold at the decision operation 808, which may result in a continued processing via "yes" route to the operation 810 that does not use the default proximity data.

The process 1000 describes uploading of the location and time specific proximity data. At 1002, a user device may measure capacitance values at a known location and time. At 1004, the user device may curve fit the values to create the refined capacitance values. At 1006, the user device may transmit the refined capacitance values along with location and time information (which may be identifiable by the server) to the server. The server may later disseminate the refined capacitance values to other user devices that are newly entering the area, performing a first start up in the area, or that otherwise request the refined capacitance values and share the same or similar location and request the data within a threshold amount of time since the collection of the data to prevent dissemination of stale or untimely proximity data.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A method comprising:
   under control of a user device configured with executable instructions,
   measuring capacitance using a proximity sensor to obtain proximity data that indicates whether the user device is within a threshold distance of a human body;
   calculating refined proximity data by analyzing the proximity data and removing outlier data;
   in response to determining at a first time that the refined proximity data is within a threshold range of previously obtained proximity data, transmitting information at a first set of transmission power levels, the first set of transmission power levels being based on capacitance values related to the previously obtained proximity data, and the first set of transmission power levels being set to reduce by a first amount from a current level, radiation emitted by the user device when the user device is within the threshold distance from the human body; and
   in response to determining at a second time that the refined proximity data is outside the threshold range of the previously obtained proximity data, transmitting additional information at a second set of transmission power levels, the second set of transmission power levels being based on capacitance values related to default proximity data that is different from the previously obtained proximity data, the second set of transmission power levels being set to reduce by a second amount from the current level, the amount of radiation emitted by the user device when the user device is within the threshold distance from the human body, and the first amount being different from the second amount.

2. The method as recited in claim 1, wherein the calculating the refined proximity data includes applying weighted regression to the proximity data to remove the outlier data.

3. The method as recited in claim 1, wherein a wireless transmitter of the user device is at least one of a mobile telephone wireless transmitter or a Wi-Fi transmitter.

4. The method as recited in claim 1, wherein the first set of transmission power levels is specified for two or more zones defined by a distance between the user device and the human body, the two or more zones associated with predetermined ranges of capacitance values.

5. A method comprising:
   under control of a user device configured with executable instructions,
   measuring capacitance using a proximity sensor to obtain proximity data;
   determining refined proximity data by analyzing the proximity data and removing outlier data;
   comparing the refined proximity data to previously obtained proximity data, the previously obtained proximity data including a set of capacitance values indicating that the user device is within a threshold distance of a human body, the previously obtained proximity data being associated with a set of transmission power levels; and
   in response to determining, by the user device, that the refined proximity data is within a threshold range of the previously obtained proximity data, transmitting information at the set of transmission power levels associated with the previously obtained proximity data.

6. The method as recited in claim 5, wherein the set of capacitance values is a first set of capacitance values and the set of transmission power levels is a first set of transmission power levels, and the method further comprises, at a second time, in response to determining that the refined proximity data is outside the threshold range of the previously obtained proximity data, transmitting additional information at a second set of transmission power levels associated with default proximity data that associates a second set of capacitance values with the second set of transmission power levels.

7. The method as recited in claim 6, further comprising transmitting the refined proximity data to a server along with an indication of a time and a geographical location associated with the refined proximity data, the refined proximity data to be shared with other user devices within a specified distance from the geographical location and within a specified time from the transmitting of the refined proximity data to the server, the shared refined proximity data to be used in place of the default proximity data.

8. The method as recited in claim 6, further comprising controlling a transmission power level of a wireless transceiver in the user device based at least in part on a determination to use the first set of transmission power levels or a determination to use the second set of transmission power levels.

9. The method as recited in claim 5, wherein determining the refined proximity data includes applying weighted regression to the proximity data to remove the outlier data.

10. The method as recited in claim 8, wherein the wireless transceiver is at least one of a mobile telephone wireless transceiver or a Wi-Fi transceiver.

11. The method as recited in claim 5, wherein the first set of transmission power levels is specified for two or more zones defined by a distance between the user device and the human body, the two or more zones being associated with predetermined ranges of capacitance values.

12. The method as recited in claim 5, further comprising:
    detecting an accessory used with the user device; and
    modifying the refined proximity data by an adjustment value associated with the accessory to compensate for inclusion of the accessory during the measuring of the capacitance.

13. The method as recited in claim 5, further comprising initiating a wireless transceiver, and wherein measuring the capacitance using the proximity sensor occurs after initiating the wireless transceiver.

14. The method as recited in claim 5, further comprising storing the refined proximity data as the previously obtained proximity data after determining to use the first set of transmission power levels to transmit the information.

15. One or more non-transitory computer-readable media storing computer-executable instructions that, when executed on one or more processors, cause the one or more processors to perform acts comprising:
    collecting, via a proximity sensor, a plurality of samples of proximity data from a user device to determine whether a portion of the user device is within a threshold distance from a human body;
    analyzing the plurality of samples of the proximity data to create refined proximity data that excludes outlier samples of the proximity data obtained during the collecting;
    comparing the refined proximity data to at least one of previously obtained proximity data or default proximity data, based at least in part on the refined proximity data being within a threshold range of the previously obtained proximity data, wherein transmission power levels associated with the previously obtained proximity data are different from transmission power levels associated with the default proximity data; and
    setting a transmission power level of a wireless transceiver based at least in part on the comparison such that the transmission power levels associated with the previously obtained proximity data are used to transmit information when the refined proximity data is within a threshold range of the previously obtained proximity data.

16. The one or more non-transitory computer-readable media as recited in claim 15, wherein the plurality of samples of proximity data is measured as capacitance, and wherein the analyzing includes applying a weighted regression to exclude the outlier samples of the plurality of samples of proximity data.

17. The one or more non-transitory computer-readable media as recited in claim 15, wherein the acts further comprise:
    determining that a location of the user device has changed and
    setting the transmission power level of the wireless transceiver such that the transmission power levels associated with the default proximity data are used to transmit additional information.

18. The one or more non-transitory computer-readable media as recited in claim 15, wherein the acts further comprise:
    detecting an accessory used with the user device; and
    modifying the refined proximity data by an adjustment value associated with the accessory to compensate for inclusion of the accessory during proximity sensing.

19. The one or more non-transitory computer-readable media as recited in claim 18, wherein the accessory is a cover for the user device that is detectable by the user device.

20. A user device, comprising:
    one or more processors;
    memory to store processor-executable instructions;
    a proximity sensor under control of the one or more processors configured to obtain proximity data indicative of a proximity of the user device to a human body;
    a wireless transceiver under control of the one or more processors configured to communicate wirelessly with another device;
    a proximity data analyzer stored in the memory and executable by the one or more processors, the proximity data analyzer to receive the proximity data obtained by the proximity sensor and create refined proximity data by removing outlier data from the proximity data; and
    a transmission power manager stored in the memory and executable by the one or more processors, the transmission power manager configured to:
        compare the refined proximity data to at least one of previously obtained proximity data or default proximity data, based at least in part on the refined proximity data being within a threshold range of the previously obtained proximity data, wherein transmission power levels associated with the previously obtained proximity data are different from transmission power levels associated with the default proximity data; and
        set a transmission power level of the wireless transceiver based at least in part on the comparison such that the transmission power levels associated with the previously obtained proximity data are used to transmit information when the refined proximity data is within a threshold range of the previously obtained proximity data.

21. The system as recited in claim 20, wherein the refined proximity data is created by applying weighted regression to the proximity data to remove the outlier data.

22. The system as recited in claim 20, wherein the wireless transceiver is at least one of a mobile telephone wireless transceiver or a Wi-Fi transceiver.

* * * * *